United States Patent
Beebe et al.

(10) Patent No.: US 6,589,823 B1
(45) Date of Patent: Jul. 8, 2003

(54) SILICON-ON-INSULATOR (SOI) ELECTROSTATIC DISCHARGE (ESD) PROTECTION DEVICE WITH BACKSIDE CONTACT PLUG

(75) Inventors: Stephen G. Beebe, Mountain View, CA (US); Srinath Krishnan, Campbell, CA (US); Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 105 days.

(21) Appl. No.: 09/792,138

(22) Filed: Feb. 22, 2001

(51) Int. Cl.[7] ............................................. H01L 21/00
(52) U.S. Cl. .................. 438/151; 438/155; 438/257; 438/347; 257/255; 257/355
(58) Field of Search ................. 438/151, 155, 438/257, 347; 257/355, 255

(56) References Cited

U.S. PATENT DOCUMENTS

| | | | |
|---|---|---|---|
| 4,753,896 A | | 6/1988 | Matloubian ................. 437/29 |
| 5,629,544 A | | 5/1997 | Voldman et al. ............ 257/355 |
| 5,886,388 A | | 3/1999 | Wada et al. ................ 257/393 |
| 5,994,738 A | | 11/1999 | Wollesen .................... 257/347 |
| 6,002,132 A | | 12/1999 | Mooney et al. .......... 250/338.4 |
| 6,063,652 A | * | 5/2000 | Kim .......................... 438/155 |
| 6,096,584 A | * | 8/2000 | Ellis-Monaghan et al. .. 438/151 |
| 6,229,165 B1 | | 5/2001 | Sakai et al. ................. 257/291 |
| 6,245,600 B1 | * | 6/2001 | Geissler et al. ............. 438/149 |
| 6,274,908 B1 | | 8/2001 | Yamaguchi et al. ........ 257/355 |
| 6,407,429 B1 | * | 6/2002 | Ko et al. .................... 257/350 |
| 6,410,962 B2 | * | 6/2002 | Geissler et al. ............. 257/355 |

FOREIGN PATENT DOCUMENTS

| | | |
|---|---|---|
| EP | 387944 A1 | 3/1989 |
| EP | 923132 A1 | 6/1999 |
| JP | 404241452 | 8/1992 |

* cited by examiner

*Primary Examiner*—Vu A. Le
*Assistant Examiner*—Pho M. Luu
(74) *Attorney, Agent, or Firm*—Renner, Otto, Boisselle & Sklar, LLP (57) ABSTRACT

An electrostatic discharge (ESD) protection device for a silicon-on-insulator (SOI) integrated circuit having a silicon substrate with a buried oxide layer disposed thereon and an active layer disposed on the buried oxide layer having active regions defined by isolation trenches. The ESD protection device is formed on the SOI integrated circuit and has an anode and a cathode formed within one of the active regions and coupled respectively to a first and a second node; and a backside contact plug adjacent and in thermal contact with at least one of the anode or the cathode, the backside contact plug traversing the buried oxide layer to thermally couple the one of the active regions and the substrate.

18 Claims, 5 Drawing Sheets

SILICON-ON-INSULATOR (SOI) ELECTROSTATIC DISCHARGE (ESD) PROTECTION DEVICE WITH BACKSIDE CONTACT PLUG

TECHNICAL FIELD

The present invention generally relates to the manufacture of semiconductor devices, and, more specifically, relates to the manufacture of silicon-on-insulator (SOI) devices particularly well suited for use as an electrostatic discharge (ESD) protection device.

BACKGROUND ART

Traditional silicon-on-insulator (SOI) devices typically have a silicon substrate having a buried oxide (BOX) layer disposed thereon. An active region of the device is defined in portions of a silicon layer (also referred to as an active layer) disposed on the BOX layer. Therefore, the device is isolated from the substrate by the BOX layer. During operation, some SOI devices generate heat. For example, a diode used as an electrostatic discharge (ESD) protection device will generate heat when conducting electrons between a protected node and a voltage potential (e.g., ground or Vss). During such an event, the heat generated by the ESD diode is not readily dissipated which may lead to failure of the ESD diode. Therefore, there exists a need in the art for dissipating heat generated from an SOI device, and particularly from an ESD protection device fabricated as part of an SOI wafer.

SUMMARY OF THE INVENTION

According to one aspect of the invention, the invention is an electrostatic discharge (ESD) protection device for a silicon-on-insulator (SOI) integrated circuit having a silicon substrate with a buried oxide layer disposed thereon and an active layer disposed on the buried oxide layer having active regions defined by isolation trenches. The ESD protection device is formed on the SOI integrated circuit and has an anode and a cathode formed within one of the active regions and coupled respectively to a first and a second node; and a backside contact plug adjacent and in thermal contact with at least one of the anode or the cathode, the backside contact plug traversing the buried oxide layer to thermally couple the one of the active regions and the substrate.

According to another aspect of the invention, the invention is a method of fabricating an electrostatic discharge (ESD) protection device for a silicon-on-insulator (SOI) integrated circuit having a silicon substrate with a buried oxide layer disposed thereon and an active layer disposed on the buried oxide layer having active regions defined by isolation trenches. The method includes the steps of forming an anode and a cathode within one of the active regions and coupling the anode and the cathode respectively to a first node and second node; and forming a backside contact plug adjacent and in thermal contact with at least one of the anode or the cathode, the backside contact plug traversing the buried oxide layer to thermally couple the one of the active regions and the substrate.

According to another aspect of the invention, the invention is a method of fabricating an electrostatic discharge (ESD) protection device for a silicon-on-insulator (SOI) integrated circuit having a silicon substrate with a buried oxide layer disposed thereon and an active layer disposed on the buried oxide layer having active regions defined by isolation trenches. The method including the steps of implanting a first portion of one of the active regions with dopant to form an anode and implanting a second portion of the one of the active regions with dopant to form a cathode; depositing a resistor-protect mask on a junction of the anode and the cathode, the resistor-protect mask defining a silicide region; forming a silicide layer in the silicide region defined by the resistor-protect mask; and forming a backside contact plug adjacent and in thermal contact with at least one of the anode or the cathode, the backside contact plug traversing the buried oxide layer to thermally couple the one of the active regions and the substrate.

BRIEF DESCRIPTION OF DRAWINGS

These and further features of the present invention will be apparent with reference to the following description and drawings, wherein.

DISCLOSURE OF INVENTION

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 1:
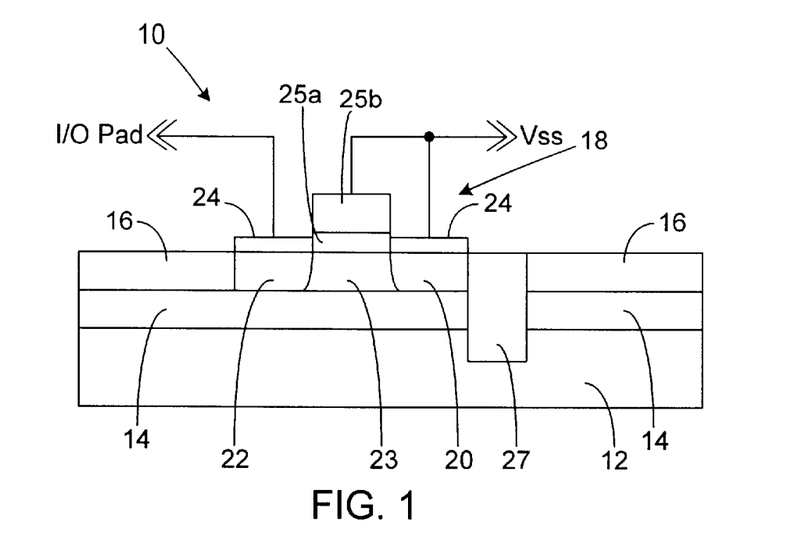
FIG. 1 is a cross-section of a first embodiment of an electrostatic discharge (ESD) protection device having a backside contact according to the present invention.

Referring to FIG. 1, a first embodiment of an electrostatic discharge (ESD) protection device 10 (also referred to herein as diode 10) is illustrated. The ESD protection device 10 is formed on a silicon-on-insulator (SOI) integrated circuit having a silicon substrate 12, a buried oxide (BOX) layer 14 formed on the substrate 12 and a silicon layer (also referred to herein as an active layer) disposed on the BOX layer 14. Within the silicon layer, shallow trench isolation (STI) regions 16 define the placement of silicon active regions, one of the active regions being used for the ESD protection device 10 and is referred to as active region 18. In an exemplary embodiment, as illustrated in FIG. 1, the active region 18 has a P+ region, or anode 20, and an N+ region, or cathode, 22. Disposed between the P+ region and the N+ region is a P region 23, which is considered to be part of the anode 20. Alternatively, an N region, which is considered part of the cathode 22, can be disposed between the P+ region and the N+ region. Therefore, references to the P region 23 should be taken to mean N region depending on the desired doping of the ESD protection device 10.

Silicide layers 24 (also known in the art as salicide structures) are formed on the anode region 20 and the cathode region 22. As is known in the art, the silicide layers 24 establish conduction to the anode region 20 and the cathode region 22. Disposed on top of the P region 23 is a gate oxide layer 25a and a polysilicon (poly) gate layer 25b as are known in the art. One or more layers of oxide (not shown) are formed to isolate the active region 18 of the ESD protection device 10. Contacts (not shown) and metal layers (not shown) are formed in the oxide to respectively establish electrical connection to the anode 20 and the cathode 22 via the silicide layers 24. Electrical connection may also be established to the poly gate layer 25b.

As indicated, the ESD protection device 10 can be used to protect a node from electrostatic discharge. For example, the cathode 22 can be coupled via the cathode's respective silicide layer 24 and any respective contacts and metal layers to an I/O pad, or other node, to be protected. In this arrangement, the anode 20 is connected to ground, or Vss, via the anode's respective silicide layer 24 and any contact and metal layers. In another arrangement, the anode 20 is coupled to the I/O pad and a cathode 22 is coupled to a supply voltage, or Vdd (not shown).

During an event where the ESD protection device 10 is actively protecting against an electrostatic discharge by carrying electrons between the I/O pad and Vss, the ESD protection device 10 has a tendency to generate heat. This heat can disrupt the performance of the ESD protection device 10 and/or permanently damage the ESD protection device 10. The present invention dissipates heat from the ESD protection device 10 using the substrate 12 as a heat sink. More specifically, the ESD protection device 10 includes a backside contact plug 27. The backside contact plug 27 is preferably disposed adjacent the anode 20 and in direct or substantially direct thermal contact therewith. Alternatively, the backside contact plug 27 can be disposed adjacent and in direct or substantially direct thermal contact with the cathode 22 or any other part of the ESD protection device 10. The backside contact plug 27 traverses the BOX layer 14 and is in physical connection with the silicon substrate 12. In the illustrated embodiment, the backside contact plug 27 extends through the BOX layer 14 and protrudes into the substrate 12 so as to establish good thermal conduction between a portion of the ESD protection device 10 and the substrate 12. In another arrangement, backside contact plugs 27 can be formed for each of the anode 20 and the cathode 22.

The backside contact plug 27 may also be used to help establish an electrical connection between one of the anode 20 or the cathode 22 and the substrate 12. More specifically, during an ESD event it may be desirable to conduct a relatively large amount of current from the protected node to the substrate (i.e., Vss) which can be accomplished with the backside contact plug 27. The connection created by the backside contact plug 27 has a relatively low resistance and is susceptible to less Joule heating than contacts used to reduce floating body effects. The backside contact plug 27 can also be used along with any contacts and metal layers to establish electrical connection between a node (such as the I/O pad or Vss) and the anode or the cathode, thereby obviating the need for at least one of the silicide layers 24.

A variety of materials can be used for the backside contact plug 27, including single metal layers as well as metal alloy layers containing two or more metals. One such appropriate metal is tungsten. In addition, other materials, such as silicon, polysilicon, silicon-germanium (SiGe) or gallium-arsenide (GaAs) may also be used for the backside contact plug 27. The backside plug 27 should have thermal conductivity in the range of about 1 W/cm-K to about 3 W/cm-K. It is noted that the thermal conductivity of the BOX layer 14 is about 0.01 W/cm-k. Alternative examples of other materials include aluminum, copper, gold, nickel, palladium, platinum, silver, tantalum, titanium, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, metal silicides, and any other alloys thereof. As will be described in greater detail below, the backside contact plug 27 can be formed before or after definition and fabrication of the other components of the device 10. Should silicon be used as the material for the backside contact plug 27, a thermal cycle may be added to the fabrication process to re-crystallize the silicon deposited for the backside contact plug 27 with the silicon of the substrate 12.

The thermal conduction of the backside contact plug 27 will limit the heating of the device 10 during an ESD stress, thereby increasing the ESD robustness of the chip as a whole. More specifically, the greater heat dissipation resulting from the backside contact plug 27 will lower the peak temperature for a given electrical stress level and increase the device's tolerance of ESD current. Although the illustrated ESD protection device 10 is a diode, other ESD protection devices, such as a transistor or other type of SOI element, can also be improved using the backside contact plug 27 described herein.

Figure 2:
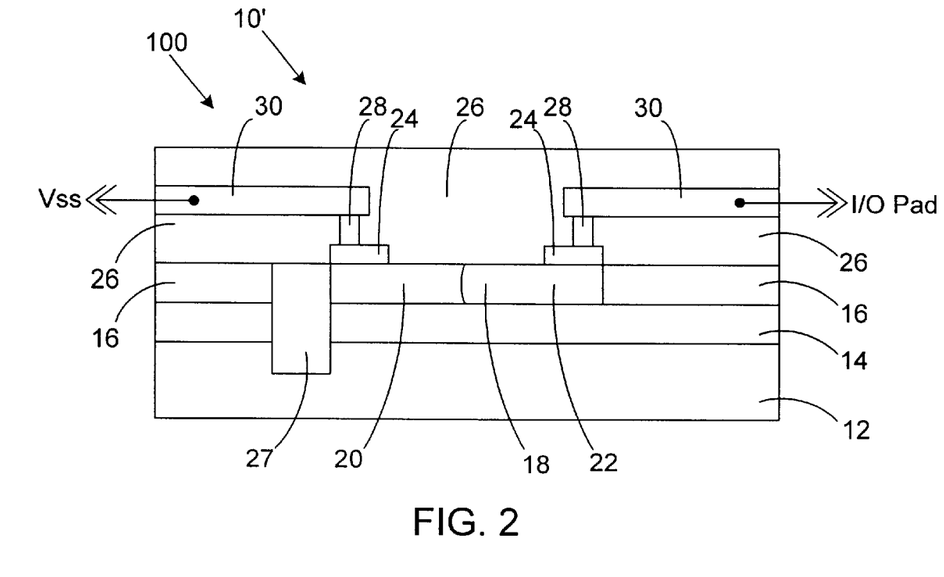
FIG. 2 is a cross-section of a second embodiment of an ESD protection device having a backside contact according to the present invention.

Referring to FIG. 2, a second embodiment of the ESD protection device 10 is illustrated. In the second embodiment, the device 10' is a salicide blocked diode 100. Although the performance and structure of the diode 100 differs from that of the device 10 illustrated in FIG. 1, the same reference numerals will be used to describe similar components of the two devices. The use of the same, or similar, reference numerals is intended to help clearly and concisely describe the invention and not to trivialize the material differences between the devices illustrated in FIGS. 1 and 2.

The diode 100 is formed on a silicon-on-insulator (SOI) integrated circuit having a silicon substrate 12, a buried oxide layer 14 formed on the substrate 12 and a silicon layer (also referred to herein as an active layer) disposed on the buried oxide layer 14. Within the silicon layer, shallow trench isolation (STI) regions 16 define the placement of silicon active regions, one of the active regions being used for the ESD protection device 10 and is referred to as active region 18. The active region 18 has a P+ region, or anode 20, and an N+ region, or cathode 22. A silicide layer 24 (also known in the art as a salicide structure) is formed on the anode region 20 distal to the P+ region and N+ region interface, or P-N junction. Another suicide layer 24 is deposited on the cathode region 22 distal to the P-N junction. As is known in the art, the silicide layers 24 establish conduction to the anode region 20 and the cathode region 22. One or more layers of oxide 26 are formed to isolate the active areas of the diode 100. Contacts 28 and metal layers 30 are formed in the oxide 26 to respectively establish electrical connection to the anode 20 and the cathode 22 through the suicide layers 24.

The diode 100 can be used use as an electrostatic discharge (ESD) protection device. For example, the cathode 22 can be coupled via the silicide layer 24 and respective contact 28 and metal layer 30 to an I/O pad, or other node, to be protected. In this arrangement the anode 20 is connected to ground, or Vss, via the anode's respective silicide layer 24, contact 28 and metal layer 30. In another arrangement the anode 20 is coupled to the I/O pad and the cathode 22 is coupled to a supply voltage, or Vdd (not shown).

Similar to the ESD protection device 10 illustrated in FIG. 1, the ESD protection device 10' of the second embodiment, or diode 100, has a backside contact plug 27 to establish a thermal and/or electrical connection between at least one part of the active region 18, such as the anode 20, and the substrate 12.

Both the P+ region and N+ region are heavily doped (e.g., about $10^{18}$ atoms/cm$^2$ to about $10^{22}$ atoms/cm$^2$) to give the diode 100 a relatively low resistance (e.g., about 100 ohm-$\mu$m to about 300 ohm-$\mu$m) which forward biases at a relatively low bias voltage (e.g., about 0.3 volts to about 0.6 volts) and breaks down at a relatively low reverse break down voltage (e.g., about 3 volts to about 4 volts), thereby exhibiting traits important for good ESD protection. In addition, as is found in the ESD protection device 10 of the first embodiment, the diode 100 having the backside contact plug 27 will have a tendency to fail at a higher stress level due to joule heating. For both embodiments, it is noted that the backside contact plug 27, in most instances, should not introduce any appreciable additional I/O capacitance.

Figure 3A:
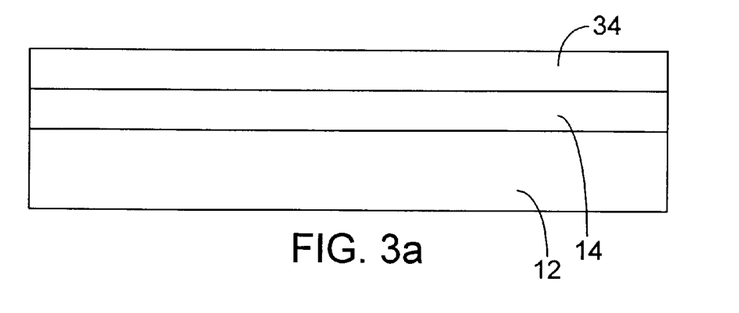
FIG. 3a is a cross-section of the ESD protection device according to the first embodiment in a first intermediate stage of manufacture.

Referring now to FIG. 3a, the ESD protection device 10 according to the first embodiment is illustrated in a first intermediate stage of manufacture. More specifically, FIG. 3a illustrates an SOI wafer, or SOI material, having the silicon substrate 12 having the buried oxide (BOX) layer 14 disposed thereon. A silicon layer 34, also referred to herein as an active layer, is disposed on the BOX layer 14 in conventional format. It is noted that, if desired, the silicon layer 34 and/or the substrate 12 can be initially doped. The SOI arrangement illustrated in FIG. 3a is manufactured using conventional techniques.

Figure 3B:
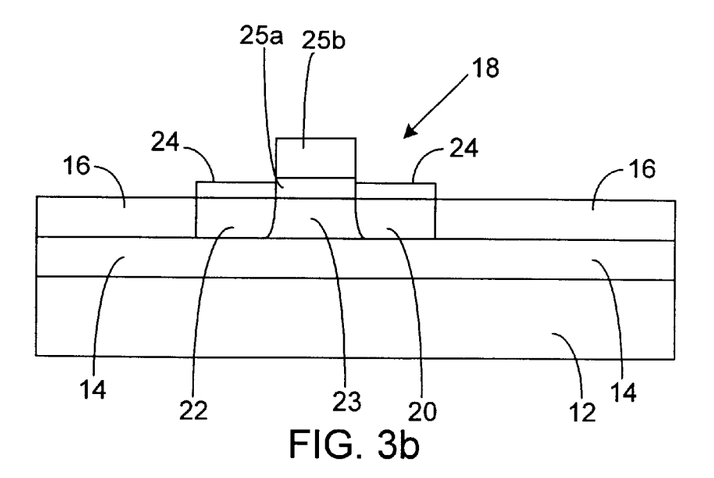
FIG. 3b is a cross-section of the ESD protection device according to the first embodiment in a second intermediate stage of manufacture.

Referring now to FIG. 3b, the active region 18 is formed by defining STI regions 16 using conventional techniques. Using a variety of techniques that are well known in the art and the order of which may be selected by the designer, the active region is doped to have the P+ region, or anode 20, and the N+ region, or cathode 22; the gate oxide layer 25a and the poly gate layer 25b are formed; spacers (not illustrated) may be formed adjacent the gate stack; and the silicide layers 24 are formed. Appropriate P+ and N+ masks may be used, as well as the gate oxide layer 25a and the poly gate layer 25b to control the implantation of dopant for the anode 20 and the cathode 22.

Figure 3C:
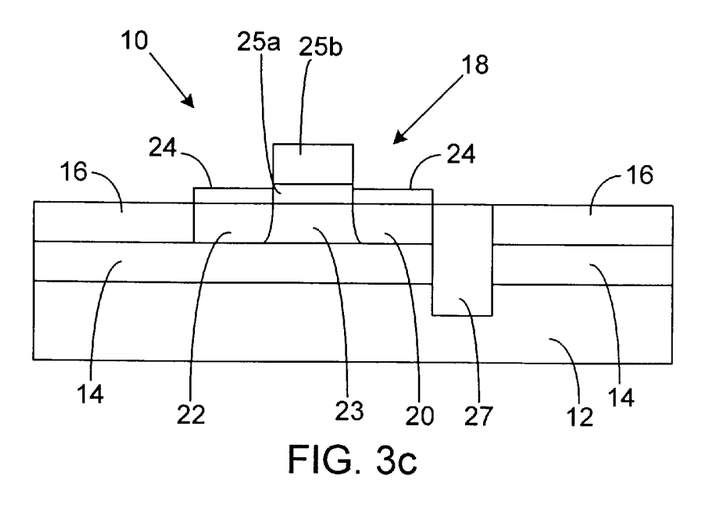
FIG. 3c is a cross-section of the ESD protection device according to the first embodiment in a third intermediate stage of manufacture.

Referring now to FIG. 3c, after definition of the ESD protection device 10 a backside contact etch step is completed to etch through the silicon layer 34 (in what is now an STI region 16) adjacent the active region 18. The etch step is also used to etch through the BOX layer 14 down to the substrate 12 and, if appropriate for the device being fabricated, into the substrate 12 as illustrated. Next, the recess formed by the backside contact etch step is filled with a conductive layer such as tungsten or one of the other materials described above. This material forms the backside contact plug 27. In this embodiment, the backside contact plug 27 is fabricated after device definition but before any contact and/or metal layers are formed. The backside plug 27 conducts heat from the active region 18 to the substrate 12 to dissipate heat generated during device operation, such as an ESD event where a typical failure mechanism of the device is overheating. As mentioned above, the backside contact plug 27 can also serve as an electrical contact for a portion of the active region 18.

As one skilled in the art will appreciate, the formation of the backside contact plug 27 can be completed before definition of the ESD protection device 10. An example of this process will be described below with respect to the second illustrated embodiment of the ESD protection device 10. When defining the backside contact plug 27 before the ESD protection device 10 is defined, the backside contact plug 27 can be made from a material (such as silicon, polysilicon, SiGe or GaAs) other than a metal or a metal alloy to make processing of the ESD protection device 10 easier. It is noted that some alternative materials may have lower thermal conduction properties than a metal. Nevertheless, the presence of a semiconductor backside contact plug 27 improves thermoconduction from the device to the substrate than would otherwise be accomplished through the BOX layer 14 alone.

Figure 4:
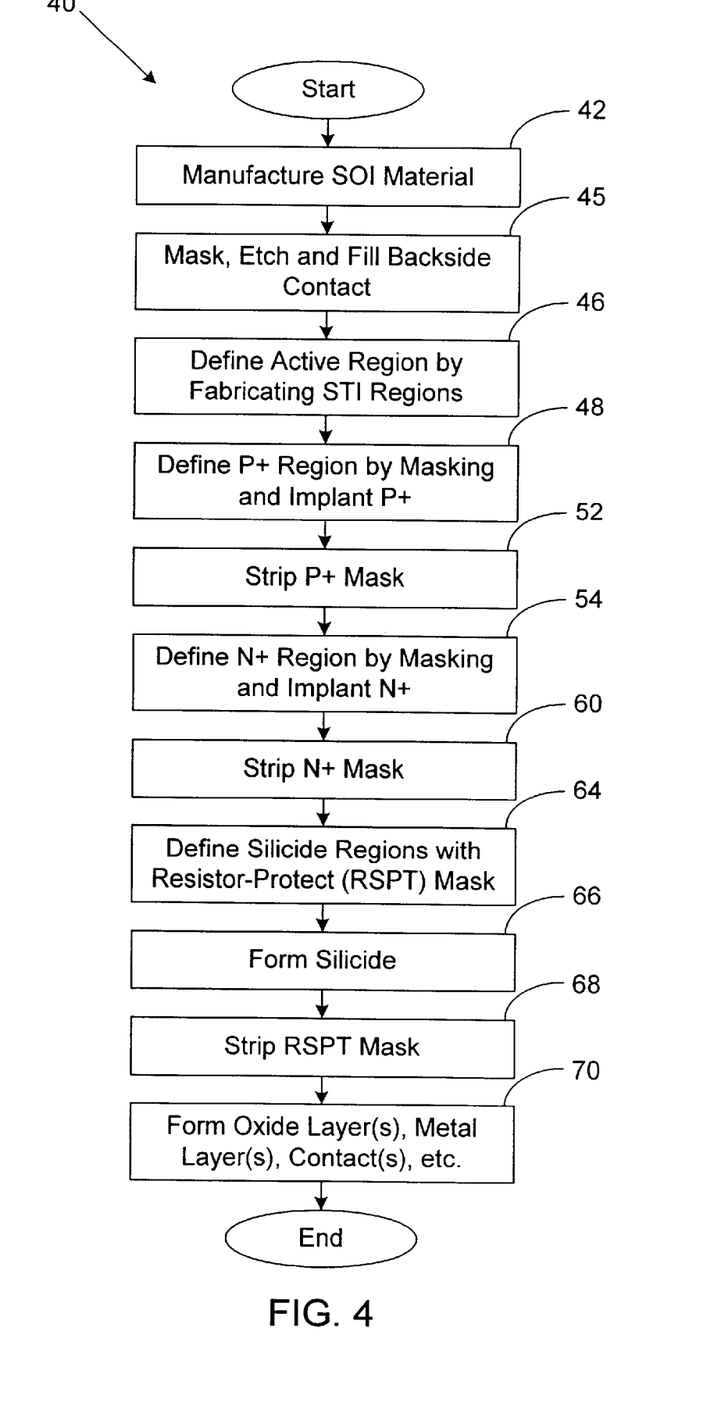
FIG. 4 is a flow diagram of a method of manufacturing the ESD protection device according to the second embodiment.

Referring now to FIG. 4, a method 40 is illustrated in flowchart format for manufacturing the diode 100 illustrated in FIG. 2. The method 40 starts in step 42 in which an SOI wafer is manufactured. With additional reference to FIG. 5a, the SOI wafer, or SOI material, has the silicon substrate 12 having the buried oxide layer 14 disposed thereon. A silicon layer 44, also referred to herein as an active layer, is disposed on the buried oxide layer 14 in conventional format. The SOI arrangement illustrated in FIG. 5a is manufactured using conventional techniques.

Figure 5A:
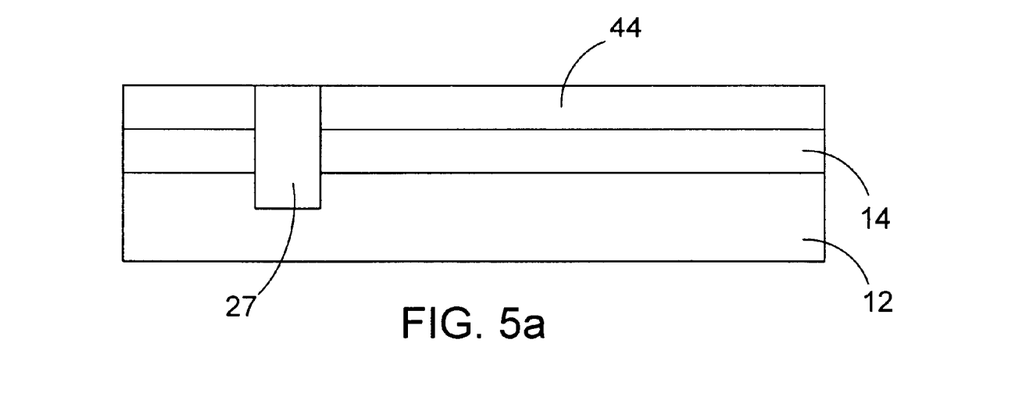
FIG. 5a is a cross-section of the ESD protection device according to the second embodiment in a first intermediate stage of manufacture.

Next, in step 45, and as illustrated in FIG. 5a, a backside contact plug 27 is formed. The backside contact plug 27 is formed by masking the SOI material to define the position of the backside contact plug 27 and etching a recess in the SOI material down to at least a top surface of the substrate and, if desired, into the substrate. Next, the recess is filled with the material selected for the backside contact plug 27.

Figure 5B:
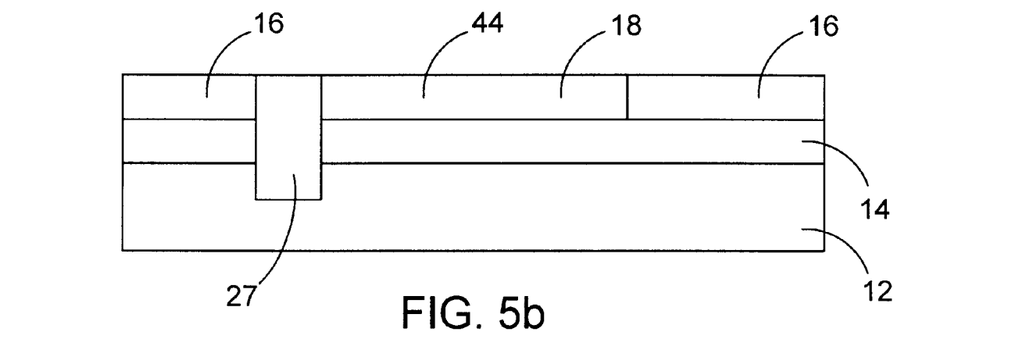
FIG. 5b is a cross-section of the ESD protection device according to the second embodiment in a second intermediate stage of manufacture.

Next, in step 46, and as illustrated in FIG. 5b, the active region 18 is defined in the silicon layer 44 by fabricating shallow trench isolation (STI) regions 16 using conventional techniques. The active region is defined to be adjacent and in thermal contact with the backside contact plug 27.

Figure 5C:
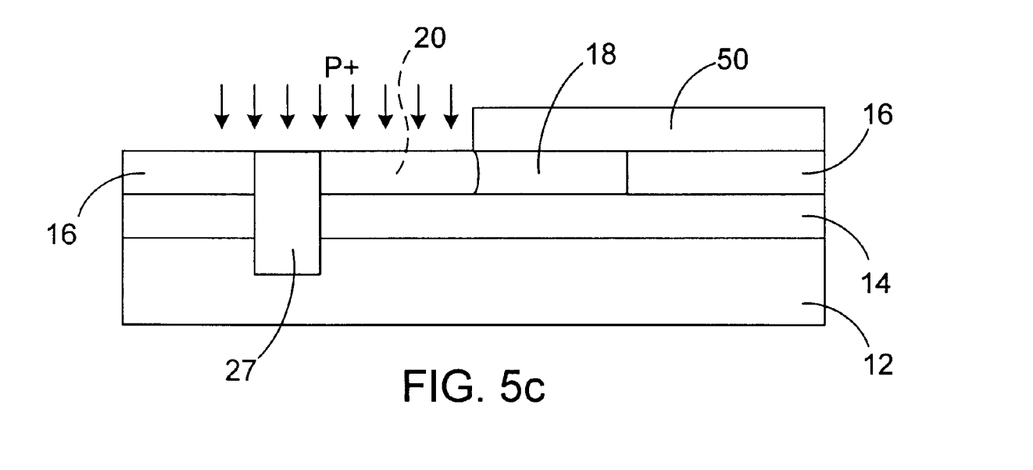
FIG. 5c is a cross-section of the ESD protection device according to the second embodiment in a third intermediate stage of manufacture.

The P+ region, or anode 20, is formed in the active region 18 in step 48 and as further illustrated by FIG. 5c. More specifically, the P+ region is defined by depositing a P+ mask 50 over areas where exposure to P+ implantation should be minimized, such as the future N+ region of the active region 18 and adjacent STI 16. Next, the device is doped using standard PMOS source/drain implants, such as on the order of about $10^{18}$ atoms/cm$^2$ to about $10^{20}$ atoms/cm$^2$, thereby forming the anode 20. Subsequently, the P+ mask is stripped from the device in step 52. The P+ implant step may be used to simultaneously dope other areas of the wafer in the fabrication of other devices.

Figure 5D:
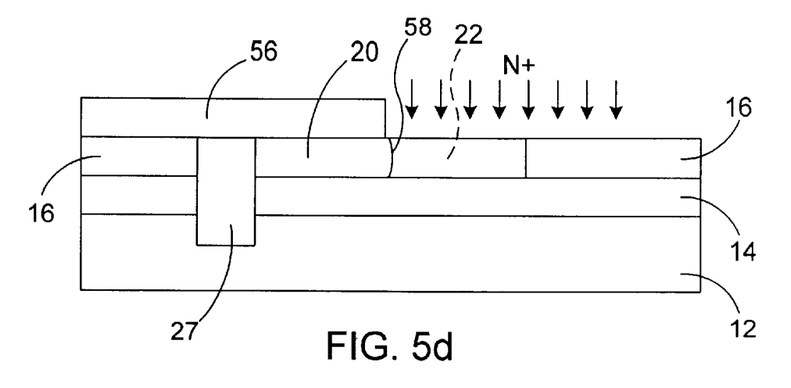
FIG. 5d is a cross-section of the ESD protection device according to the second embodiment in a fourth intermediate stage of manufacture.

In similar fashion, the N+ region, or cathode 22, is formed in the active region 18 in step 54 and as further illustrated by FIG. 5d. More specifically, the N+ region is defined by depositing an N+ mask 56 over the P+ region, or anode 20, and adjacent STI 16. Next, the device is doped using standard NMOS source/drain implants, such as on the order of about $10^{18}$ atoms/cm$^2$ to about $10^{20}$ atoms/cm$^2$, thereby forming the cathode 22. The N+ implant step may be used to simultaneously dope other areas of the wafer in the fabrication of other devices.

It is noted that, openings in the N+ and P+ masks should overlap with each other by at least the tolerance, or error margin in placement, of the mask to ensure that there is no undoped region in the area of a P-N junction 58 formed at the interface of the P+ region and the N+ region. As mentioned, the N+ and P+ regions are implanted using standard NMOS and PMOS source/drain implants, respectively. Other implants, such as extension and halo implants, may or may not be blocked as is desired for the anticipated function of the diode 100 being manufactured. Subsequent to the N+ doping, the N+ mask is stripped from the device in step 60. As one skilled in the art will appreciate, the active region 18 can be doped with N+ implants prior to being doped with P+ implants thereby reversing pairs of steps 48/52 and 54/60.

Figure 5E:
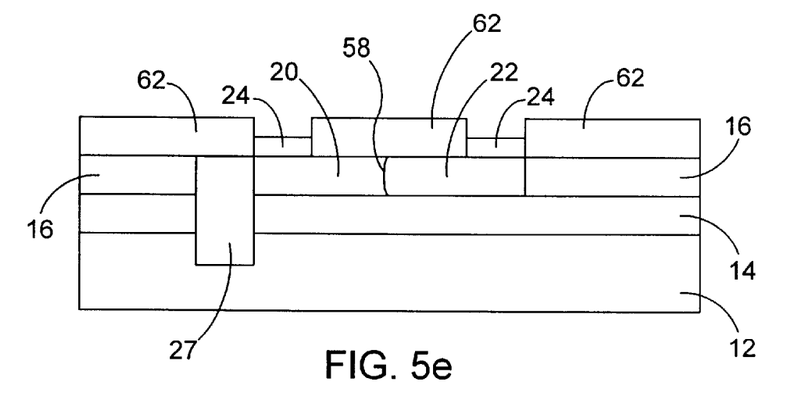
FIG. 5e is a cross-section of the ESD protection device according to the second embodiment in a fifth intermediate stage of manufacture.

After the active region 18 has been doped, the regions for silicidation are defined by depositing a resistor-protect (RSPT) mask 62 in step 64 and as illustrated in FIG. 5e. It is noted that salicidation is taken herein to have the same meaning as silicidation. The RSPT mask 62 is placed in all regions where silicide is not desired. More specifically, the RSPT mask 62 is placed over the P-N junction 58 and extends over the P+ region and the N+ region to block the deposition of silicide over the desired active portions of the N+/P+ function. The area masked by the RSPT mask 62 is selected to result in a desired resistance of the diode 100 since, as the size of the silicide layers 24 increases, the resistance of the diode decreases. It should be appreciated that the RSPT mask 62 is used to block the silicide layers 24 from the central junction region of the active region 18, but the silicide layers 24 are allowed to form on the distal areas of the anode 20 and cathode 22, respectfully, to provide conduction to other devices or nodes as described in greater detail above. RSPT mask 62 is also deposited over the STI regions 16 to prevent silicide formation on the STI regions 16. The RSPT mask 62, typically an oxide, is conventionally used to define resistors formed on the wafer and is therefore typically a part of existing steps in most overall wafer fabrication processes. Accordingly, the RSPT mask 62 used for the salicide blocking function is deposited using the conventional techniques used when defining resistor elements.

Once the RSPT mask 62 is formed to define the silicide regions, the silicide layers 24 are formed in step 66 using conventional techniques. More specifically, silicide is formed depositing metal in at least the unmasked areas and reacting the metal with the exposed silicon areas of the anode 20 and cathode 22. Preferably, a TiSi$_2$ (titanium) salicide process is employed, although CoSi$_2$ (cobalt), PtSi$_2$ (platinum) and MoSi$_2$ (molybdenum) salicide processes may also be used. Next, the RSPT mask 62 is stripped in step 68 using conventional techniques.

Figure 5F:
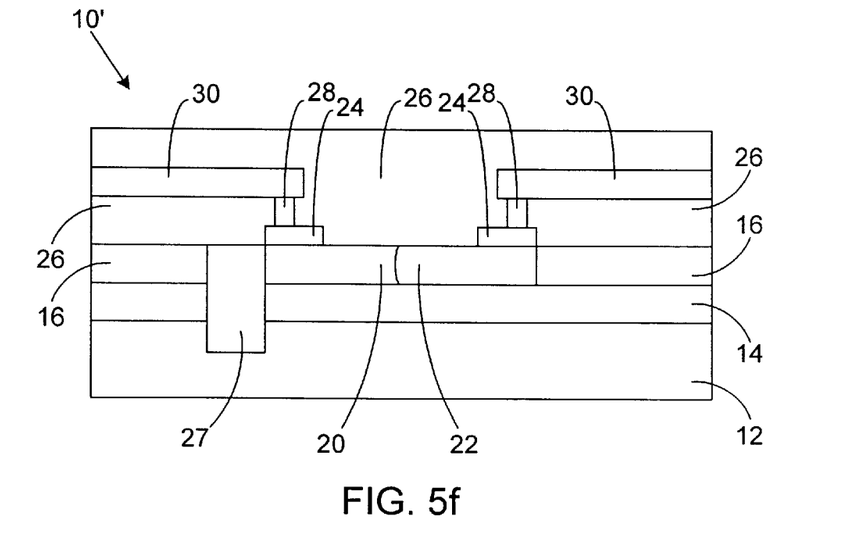
FIG. 5f is a cross-section of the ESD protection device according to the second embodiment in a last stage of manufacture.

Subsequently, the oxide material 26, the contacts 28 and the metal layers 30 are formed using conventional techniques in order to protect the diode 100, isolate the two silicide layers 24 and couple the diode 100 to other devices or nodes as is desired. The formation of the oxide material 26, the metal layers 30 and the contacts 28 are completed in step 70 and shown in an exemplary formation in FIG. 5f. As mentioned above, the backside contact plug 27 can be used instead of the silicide layer 24 to couple an adjacent portion of the active region 18 to a node. In this arrangement, only one silicide layer will be formed in steps 64 and 66.

Although particular embodiments of the invention have been described in detail, it is understood that the invention is not limited correspondingly in scope, but includes all changes, modifications and equivalents coming within the spirit and terms of the claims appended hereto.

What is claimed is:

1. An electrostatic discharge (ESD) protection device for a silicon-on-insulator (SOI) integrated circuit having a silicon substrate with a buried oxide layer disposed thereon and an active layer disposed on the buried oxide layer having active regions defined by isolation trenches, the ESD protection device formed on the SOI integrated circuit and comprising:
   an anode and a cathode formed within one of the active regions and coupled respectively to a first and a second node; and
   a backside contact plug adjacent and in thermal contact with at least one of the anode or the cathode, the backside contact plug traversing the buried oxide layer to thermally couple the one of the active regions and the substrate.

2. The ESD protection device according to claim 1, wherein the backside contact plug protrudes into the substrate.

3. The ESD protection device according to claim 1, wherein the backside contact plug is formed before the anode and the cathode.

4. The ESD protection device according to claim 1, wherein the backside contact plug is formed after the anode and the cathode.

5. The ESD protection device according to claim 1, wherein the backside contact plug is tungsten.

6. The ESD protection device according to claim 1, wherein the backside contact plug is a semiconductor material.

7. The ESD protection device according to claim 1, wherein the one of the active regions has at least one silicide layer to establish electrical connection to one of the anode or the cathode, the placement of the suicide layer being defined by a resistor-protect mask.

8. The ESD protection device according to claim 7, wherein the anode and the cathode are respectively implanted with P+ and N+ dopant before deposition of the resistor-protect mask.

9. The ESD protection device according to claim 1, wherein electrical connection between one of the anode or the cathode and the respective first or second node is established through the backside contact plug.

10. The ESD protection device according to claim 1, wherein the backside contact plug has a thermal conductivity of about 1 W/cm-K to about 3 W/cm-K.

11. The ESD protection device according to claim 1, wherein the ESD protection device is a salicide block diode.

12. The ESD protection device according to claim 11, wherein the ESD protection device has a resistance of about 100 ohm-$\mu$m to about 300 ohm-$\mu$m.

13. The ESD protection device according to claim 11, wherein the ESD protection device forward biases at about 0.3 volts to about 0.6 volts.

14. The ESD protection device according to claim 11, wherein the ESD protection device has a reverse break down voltage of about 3 volts to about 4 volts.

15. The ESD protection device according to claim 1, wherein the anode includes a P+ region and a P region adjacent the cathode.

16. The ESD protection device according to claim 1, wherein the cathode includes an N+ region and an N region adjacent the anode.

17. The ESD protection device according to claim 1, wherein the backside contact plug is laterally adjacent a side of the anode or the cathode.

18. An electrostatic discharge device (ESD) protection device for a semiconductor-on-insulator integrated circuit having a semiconductor substrate with an insulating layer disposed thereon and an active layer disposed over the insulating layer, the ESD protection device formed over the insulating layer and comprising:

an anode coupled to a first node;

a cathode coupled to a second node; and a backside contact plug adjacent and in thermal contact with one of the anode or the cathode, the backside contact plug traversing an opening in the insulating layer to thermally couple the one of the anode or the cathode to the substrate.

* * * * *

UNITED STATES PATENT AND TRADEMARK OFFICE
CERTIFICATE OF CORRECTION

PATENT NO. : 6,589,823 B1
DATED : July 8, 2003
INVENTOR(S) : Beebe et al.

It is certified that error appears in the above-identified patent and that said Letters Patent is hereby corrected as shown below:

Column 5,
Lines 3 and 11, replace "suicide" with -- silicide --.

Column 8,
Line 44, replace "suicide" with -- silicide --.

Signed and Sealed this

Nineteenth Day of August, 2003

JAMES E. ROGAN
*Director of the United States Patent and Trademark Office*